(12) United States Patent
Weippert

(10) Patent No.: US 9,158,207 B2
(45) Date of Patent: Oct. 13, 2015

(54) OPTICAL COMPONENT COMPRISING RADIATION PROTECTIVE LAYER

(75) Inventor: Hans-Joachim Weippert, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 388 days.

(21) Appl. No.: 13/564,983

(22) Filed: Aug. 2, 2012

(65) Prior Publication Data

US 2013/0038849 A1    Feb. 14, 2013

Related U.S. Application Data

(60) Provisional application No. 61/521,560, filed on Aug. 9, 2011.

(51) Int. Cl.
| | |
|---|---|
| B32B 27/38 | (2006.01) |
| G03F 7/20 | (2006.01) |
| G02B 5/20 | (2006.01) |
| G02B 5/22 | (2006.01) |
| B82Y 20/00 | (2011.01) |

(52) U.S. Cl.
CPC ............ G03F 7/70341 (2013.01); B32B 27/38 (2013.01); B82Y 20/00 (2013.01); G02B 5/206 (2013.01); G02B 5/208 (2013.01); G02B 5/22 (2013.01); G03F 7/70958 (2013.01); *G02B 2207/101* (2013.01); *Y10T 428/31511* (2015.04)

(58) Field of Classification Search
CPC .. G02B 2207/101; G02B 5/206; G02B 5/208; G02B 5/22; G03F 7/70958; C08L 63/00; C09D 163/00; B32B 27/20; B32B 27/38
See application file for complete search history.

(56) References Cited

U.S. PATENT DOCUMENTS

| | | | | |
|---|---|---|---|---|
| 5,354,808 | A | * 10/1994 | Onwumere et al. | ........... 524/837 |
| 6,097,536 | A | 8/2000 | Bauer et al. | |
| 6,242,065 | B1 | * 6/2001 | Blomberg et al. | ............ 428/64.1 |
| 6,574,039 | B1 | 6/2003 | Murata et al. | |
| 7,081,278 | B2 | 7/2006 | Lipson et al. | |
| 7,508,490 | B2 | 3/2009 | Nagasaka et al. | |
| 7,697,111 | B2 | 4/2010 | Shirai et al. | |
| 7,710,653 | B2 | 5/2010 | Ikezawa et al. | |

(Continued)

FOREIGN PATENT DOCUMENTS

WO      WO 2008/031576      3/2008

*Primary Examiner* — Peter B Kim
*Assistant Examiner* — Michelle Iacoletti
(74) *Attorney, Agent, or Firm* — Fish & Richardson P.C.

(57) ABSTRACT

An optical component for transmitting radiation includes a radiation protective layer, which includes at least one oxide material selected from germanium dioxide ($GeO_2$), antimony pentoxide ($Sb_2O_5$), aluminum oxide ($Al_2O_3$), niobium(V) oxide ($Nb_2O_5$), tin oxide ($SnO_2$), metal oxides of rare earths, in particular lanthanum oxide ($La_2O_3$) or cerium oxide ($CeO_2$), yttrium oxide ($Y_2O_3$), yttrium aluminum oxides, zinc oxide (ZnO), indium oxide ($In_2O_3$), bismuth trioxide ($Bi_2O_3$), barium titanate ($BaTiO_3$) and spinels, such as magnesium aluminate ($MgAl_2O_4$). The radiation protective layer can be varnish-like, and the oxide material can be contained in a binder of the varnish-like radiation protective layer.

24 Claims, 3 Drawing Sheets

(56) References Cited

U.S. PATENT DOCUMENTS

| | | |
|---|---|---|
| 7,781,029 B2 | 8/2010 | Lipson et al. |
| 2001/0031272 A1* | 10/2001 | Noguchi et al. ............. 424/401 |
| 2003/0192457 A1* | 10/2003 | Mager ...................... 106/287.1 |
| 2005/0022697 A1 | 2/2005 | Benrashid et al. |
| 2006/0238876 A1* | 10/2006 | Erdmann et al. ............. 359/626 |
| 2006/0240365 A1* | 10/2006 | Lipson et al. ................ 430/395 |
| 2007/0080362 A1* | 4/2007 | Scotch et al. .................. 257/99 |
| 2007/0127133 A1 | 6/2007 | Momoda et al. |
| 2007/0188879 A1 | 8/2007 | Ikezawa et al. |
| 2007/0201011 A1 | 8/2007 | Kokubun et al. |
| 2010/0003498 A1 | 1/2010 | Weir et al. |
| 2010/0277056 A1* | 11/2010 | Kostka et al. ................ 313/489 |

* cited by examiner

OPTICAL COMPONENT COMPRISING RADIATION PROTECTIVE LAYER

CROSS-REFERENCE TO RELATED APPLICATIONS

This application claims benefit under 35 U.S.C. 119(e)(1) to U.S. Provisional Application 61/521,560, filed Aug. 9, 2011. The contents of this application are incorporated by reference herein in their entirety.

FIELD

The disclosure relates to an optical component transmitting radiation and a radiation protective layer the optical component.

BACKGROUND

U.S. Pat. No. 6,097,536 describes an assembly including a holder and a component (optical component) adhesively bonded via an adhesive. The component transmits radiation in the ultraviolet spectral range. The adhesive is curable by UV light. Between the transparent component and the adhesive, a thin radiation protective layer is applied in the region of the adhesive. To protect the adhesive against UV radiation, the thin layer transmits light in a spectral range suitable for the curing of the adhesive, e.g. at the mercury I-line 365 nm, and the thin layer highly reflects or absorbs UV light from a used spectral range within the spectral range transmitted by the transparent component. The radiation protective layer includes a material selected from tantalum pentoxide, hafnium dioxide, titanium dioxide, zinc sulfide, cerium fluoride, magnesium fluoride, cryolite or mixtures thereof.

In addition or as an alternative to the protection of an adhesive, however, a radiation protective layer can also be of advantage for protecting a fluid-repellent layer, e.g. a water-repellent layer, against UV radiation, as is described for example in WO 2008/031576 A1 of the present applicant. Such a water-repellent layer or coating can include, e.g., silanes, siloxanes, diamond-like carbon (DLC), fluorides, hydrophobic varnishes and adhesives, and also of polymers, in particular of fluoropolymers, such as are sold for example under the name Optron, WR1 and Teflon AF. In this case, the material of the fluid-repellent layer can likewise be curable by (UV) radiation or thermally curable (e.g., Ormocer). Fluid-repellent layer materials, too, are typically not stable over the long term if they are exposed to UV light at radiation intensities such as are customary in microlithography. However, other components, too, e.g., seals, are possibly not stable over the long term and can be protected against UV radiation having high intensity with the aid of a radiation protective layer.

The radiation protective layer is desirably opaque to radiation in the (UV) spectral range transmitted by the optical component. In addition, the radiation protective layer desirably has a sufficient transmission in the spectral range used for curing the adhesive or, if appropriate, the fluid-repellent material. Further, the radiation protective layer should have a good adhesion on the optical component and also a sufficient adhesion for the applied adhesive or the fluid-repellent layer. Moreover, the radiation protective layer should have no adverse influence on the curing of the adhesive or the fluid-repellent material. The radiation protective layer should also be water-insoluble and have a high aging stability particularly with respect to short-wave (UV) radiation.

SUMMARY

The disclosure provides an optical component including an improved radiation protective layer and also an optical arrangement including such a component.

In one aspect, the disclosure provides an optical component for transmitting radiation which includes a radiation protective layer. The radiation protective layer includes a material selected from germanium dioxide ($GeO_2$), antimony pentoxide ($Sb_2O_5$), aluminum oxide ($Al_2O_3$), niobium(V) oxide ($Nb_2O_5$), tin oxide ($InO_2$), metal oxides of rare earths, in particular lanthanum oxide ($La_2O_3$) or cerium oxide ($CeO_2$), yttrium oxide ($Y_2O_3$), yttrium aluminum oxides, zinc oxide ($ZnO$), indium oxide ($In_2O_3$), bismuth trioxide ($Bi_2O_3$), barium titanate ($BaTiO_3$) and spinels, such as magnesium aluminate ($MgAl_2O_4$).

These materials have proved to be particularly advantageous in practice, in particular as far as their absorption properties for UV radiation are concerned. The adhesion properties on the material of the optical component and also to the adhesive layer possibly applied to the radiation protective layer, or the possibly applied fluid-repellent layer, have also proved to be particularly advantageous in the case of these materials. Moreover, the above-mentioned materials have a sufficiently high transmission in a wavelength range in which an adhesive layer is typically cured.

In one embodiment, the radiation protective layer is varnish-like (varnish layer) and the oxide material is contained in a binder of the varnish-like radiation protective layer. Such a varnish-like radiation protective layer can be applied to the optical component manually. It is therefore possible to dispense with the use of a mechanical and complex vapor deposition or sputtering method. In this case, the oxide material can be present in the binder, such as in the form of a dispersion.

In one embodiment, the oxide material is contained in a binder in the form of nanoparticles with an oxide material particle size distribution having a maximum of typically between approximately 3 and 30 nm, preferably between approximately 10 and 20 nm. In general, the oxide material nanoparticles have a maximum size of 100 nm. Oxide material nanoparticles having particle sizes greater 100 nm can be undesirable. The oxide material nanoparticles serve as filling material and can improve the optical properties of the radiation protective layer since they can be bound optically homogeneously into the binder matrix. This results in homogeneous absorption properties with defined absorption edges by comparison with fillers having larger particle sizes, which exhibit optically inhomogeneous behavior even upon optimal dispersion into the binder. Irradiation experiments in laser optics have shown that the radiation resistance of varnish binders based on cycloaliphatic epoxy resins can also be significantly improved by the addition of absorbent nanoparticles. Nanoparticles furthermore improve the varnish adhesion and the hardness of the varnish film and appreciably reduce the water absorption. The use of dispersions of nanoscale fillers (sol-gel), aqueous or alcohol-based, is particularly suitable if the resulting radiation protective layer is intended to be of small layer thickness.

In particular, it is possible to choose oxide materials whose absorption edge is at higher wavelengths than a corresponding absorption edge of the varnish binder. In particular antimony pentoxide ($Sb_2O_5$), tin oxide ($SnO_2$) or zirconium dioxide ($ZrO_2$) have proved to be expedient for an addition to the binder.

In one embodiment, the binder is inorganic. The binder can contain at least one alkyl silicate, e.g. (tetra)methyl/ethyl/ propyl silicate, in particular an alkyl polysilicate or a methyl/ ethyl polysilicate. Alkyl silicate binders are used, for example, for weather-/aging- and UV-resistant coatings in building material chemistry. Furthermore, sodium and/or potassium water glass can also be used as constituents of the binder. Lithium water glass is less suitable owing to typically insufficient alkalinity. In this case, the crosslinking typically takes place via hydrolysis with sufficient air humidity (should be sufficiently high, i.e. min. 50% rel. air humidity).

In a further development, the binder contains at least one epoxy resin free of aromatic compounds e.g. a cycloaliphatic or aliphatic epoxy resin. A (nanoscale) oxide material e.g. antimony pentoxide ($Sb_2O_5$), in the form of a (nano)dispersion, can be added to the resin in order to shift the absorption edge of the binder to longer wavelengths. Furthermore, the addition of the oxide material can also have an advantageous effect on the mechanical properties of the varnish-like radiation protective layer. In order to cure the varnish-like radiation protective layer, an amine-based hardener, for example, can be added to it.

In one embodiment, the radiation protective layer is opaque to radiation at a wavelength of less than 260 nm, preferably of less than 220 nm. Opaqueness to radiation below the wavelength is of advantage in order to effectively absorb stray radiation that arises in the transmissive optical component if the wavelength of the used radiation is in the UV range at 248 nm or at 193 nm.

The radiation opaqueness of the radiation protective layer can be achieved if the abovementioned materials are applied to the optical component e.g. by sputtering or vapor deposition with a thickness of 100 nm or more, i.e. with a thickness which ensures that the UV radiation cannot penetrate through the absorbent radiation protective layer. However, the thickness of the absorbent layer should not be chosen to be excessively large, in order to prevent layer detachment (delamination). It goes without saying that the thickness of a varnish-like radiation protective layer is generally greater than that of a layer applied by vapor deposition. Typical thicknesses of varnish-like radiation protective layers (also designated as optical varnishes) is approximately 10 μm to 50 μm. In the case of coating systems including a high filler proportion, however, it is also possible to achieve layer thicknesses of up to 1 mm.

In a further embodiment the radiation protective layer has a transmission of more than 25%, such as more than 40%, for radiation at a wavelength of more than 360 nm, preferably of more than 380 nm. This is advantageous in order to make it possible to cure a (UV curable) adhesive layer applied to the radiation protective layer via a mercury lamp, i.e. at an effective wavelength of approximately 365 nm, or via an LED lamp at a wavelength of e.g. approximately 365 nm, 375 nm or 385 nm.

In one embodiment, an adhesive layer is applied on the radiation protective layer in order to fix the optical component to a holder or a mount. In this case, the adhesive layer is typically applied in a circumferential, generally cylindrical edge region of the optical component, at which the optical component is inserted into the holder. The adhesive layer can, if appropriate, also partly extend into the region of the mutually opposite end sides of the optical component. In order to cure the adhesive layer in the mount after insertion of the optical component, use is preferably made of an adhesive material which is curable by (UV) radiation e.g. an epoxy-resin-based adhesive curable at wavelengths around the mercury I-line (at 365 nm).

In a further embodiment, at least one fluid-repellent layer, in particular a hydrophobic layer, is applied on the radiation protective layer. The fluid-repellent layer can serve, for example, to prevent a liquid, e.g. an immersion liquid, from being able to pass into the region of an interspace (gap) between a mount and the optical component. Depending on the type of immersion liquid used, the fluid-repellent layer can be embodied as hydrophobic or hydrophilic. If water, for example, is used as immersion liquid, the fluid-repellent layer is a hydrophobic layer.

In this case, the material of the hydrophobic layer is preferably selected from the group including: chromium dioxide ($CrO_2$), silanes, in particular fluoroalkylsilanes, siloxanes, diamond-like carbon (DLC), fluorides, hydrophobic varnishes, polymers, in particular fluoride polymers, e.g. Optron, WR1 and Teflon AF. Optron is a type of coating manufactured by Merck; Teflon AF is sold by Cytop. Siloxanes can be curable by UV light or thermally curable (e.g. Ormocer) or can be applied with a CVD method. All of the substances mentioned above are not stable over the long term if they are exposed to UV light at radiation intensities such as are customary in microlithography. In addition, in the case of some of the materials mentioned above, the substrate adhesion and the hydrophobic properties can be detrimentally affected by the UV light. By applying the hydrophobic layer to the radiation protective layer, it is possible for the hydrophobic layer to be effectively protected against stray radiation from the transmissive optical component. The hydrophobic properties of the UV-stable radiation protective layer that are possibly present are generally not sufficiently pronounced to use the layer by itself as a hydrophobic layer.

The radiation protective layer is typically formed outside the optically free diameter of the optical component. The optically free diameter of the optical component is understood to be that region through which radiation passes in a directional manner i.e. that region which, e.g. in the case of a lens element, contributes to imaging. In this case, the optically free diameter can be defined, in particular, by that region of the surface at which the optical component is polished, whereas the region outside the diameter has an unpolished, matt surface. If appropriate, the edge of the optically free diameter of the optical component can also be formed by the radiation protective layer itself, that is to say that the radiation protective layer serves as an aperture stop.

In a further embodiment, the radiation protective layer, the adhesive layer and/or the fluid-repellent layer is/are applied by a method selected from the group including: sputtering, PVD, CVD, PECVD, cold gas spraying, spin coating, plasma spraying, dip coating and manual coating, in particular brushing or application using a sponge, or by a sol-gel process. Sputtering, also called cathode sputtering, is a layer deposition method which makes it possible to achieve a high quality of the layer to be applied with a very small layer thickness. The three methods mentioned below concern techniques for coating substrates by vapor deposition onto the surfaces to be coated. In cold gas spraying, the coating material in powder form is applied to the carrier material at very high speed. In spin coating, thin and uniform layers are applied or spun onto a rotating substrate. In plasma spraying a powder is introduced by nozzle into a plasma jet and melted by the high plasma temperature and is spun by the plasma jet onto the workpiece to be coated. Using dip coating, it is possible for the coating to be applied uniformly. Brushing and application with the aid of a sponge, finally, are possibilities for manual coating, i.e. for applying a varnish-like coating. Some materials, e.g. zirconium dioxide ($ZrO_2$), hafnium oxide ($HfO_2$), titanium dioxide ($TiO_2$), aluminum oxide ($Al_2O_3$) etc., can also be applied in a so-called sol-gel process (wet process)

with the aid of a polymerization reaction, as is explained for example in U.S. Pat. No. 6,574,039 A1, which is incorporated herein by reference.

In order to be able to use the optical component for microlithography, it is formed from a material transparent to wavelengths in the UV range (of less than 260 nm), preferably from quartz glass ($SiO_2$), from calcium fluoride ($CaF_2$) or from magnesium fluoride (MgF2). If appropriate, the optical component can also be formed from germanium oxide ($GeO_2$), even though this material is typically no longer transparent below 360 nm. Quartz glass, in particular, is a typical lens element material for microlithography.

In a further embodiment, the optical component has a conically shaped partial region for dipping into an immersion liquid. Since the conically shaped partial region is at least partly (at the end side) in contact with the immersion liquid, there is the risk of the immersion liquid wetting the conical lateral surface, wherein the wetting can extend from there as far as an adjacent, for example planar, surface region. By applying at least one hydrophobic layer to the conical lateral surface and/or the surface region adjacent thereto, it is possible to avoid wetting and hence a decrease in the temperature of the optical component in this region.

Additionally or alternatively, the hydrophobic layer can, if appropriate, also be applied to an edge region, e.g. to a side surface of the lens element, at which the lens element is connected to a holder or mount. It is thereby possible, if appropriate, to prevent water from penetrating into a gap between the optical component and the mount, an adhesive typically being introduced into the gap. It goes without saying that both the hydrophobic layer and the adhesive layer can be applied on the radiation protective layer and thus be protected against damaging UV radiation.

A further aspect of the disclosure relates to an optical arrangement, in particular a projection exposure apparatus for immersion lithography, including at least one optical component as described above. The optical component can be in contact with the immersion liquid and form, e.g., a terminating element of a projection lens. However, the optical component can also be a component which is adjacent to the terminating element and which is likewise at least partly exposed to the immersion liquid. It goes without saying that the optical component can, of course, also be a component, e.g. a lens element, which is not in contact with the immersion liquid.

In a further embodiment, the optical arrangement includes a holder or a mount for retaining the at least one optical component at a (circumferential) side surface of the optical component. The side surface can be e.g. a cylindrical side surface of the optical component, e.g. a cross-sectionally round lens element or a plane plate. An adhesive layer is typically applied between the holder and the side surface of the optical component in order to fix the optical component to the holder. As has been explained above, it is of advantage if the adhesive layer is protected against stray radiation from the optical component, which can be achieved with the aid of the radiation protective layer. In particular, at least one fluid-repellent layer can be applied to the radiation protective layer in order to prevent a liquid, e.g. water, from being able to pass into the gap between the optical element and the holder.

In a further embodiment, the optical arrangement additionally includes at least one sealing element, such as an O-ring. The sealing element is arranged in so that it is protected against stray radiation from the optical component against light aging by the radiation protective layer. In this case, the sealing element is typically arranged between the optical component and a further component of the optical arrangement (e.g. a nozzle) in order to protect a side surface at which the optical component is inserted into the holder or into the mount against an immersion liquid. Since the (plastics) materials or polymer materials from which sealing elements are typically produced generally do not withstand long-term irradiation by intensive UV radiation, it has been proved to be expedient if the sealing element or elements is or are arranged so as to be protected against stray radiation. It goes without saying that the radiation protective layer can protect not only seals but also other components of the optical arrangement against stray radiation from the optical component.

In a further embodiment, the optical arrangement includes a projection lens, in which the at least one optical component is arranged, and an immersion liquid, in particular water, wherein the optical component preferably dips into the immersion liquid at least partly, i.e. at least with its end side. The immersion liquid increases the refractive index of the medium between the projection lens and a light-sensitive substrate (resist), and therefore leads to an increase in the resolution and depth of focus. It goes without saying that the optical component need not necessarily be in contact with the immersion liquid; rather, an arbitrary optical component within the projection lens can also be provided with a radiation protective layer, e.g. in order to protect an adhesive layer against stray radiation from the optical component.

Further features and advantages of the disclosure are evident from the following description of exemplary embodiments of the disclosure, with reference to the figures, which show details of the disclosure, and from the claims. The individual features can be realized in each case individually by themselves or in any desired combination.

DETAILED DESCRIPTION

Figure 1:
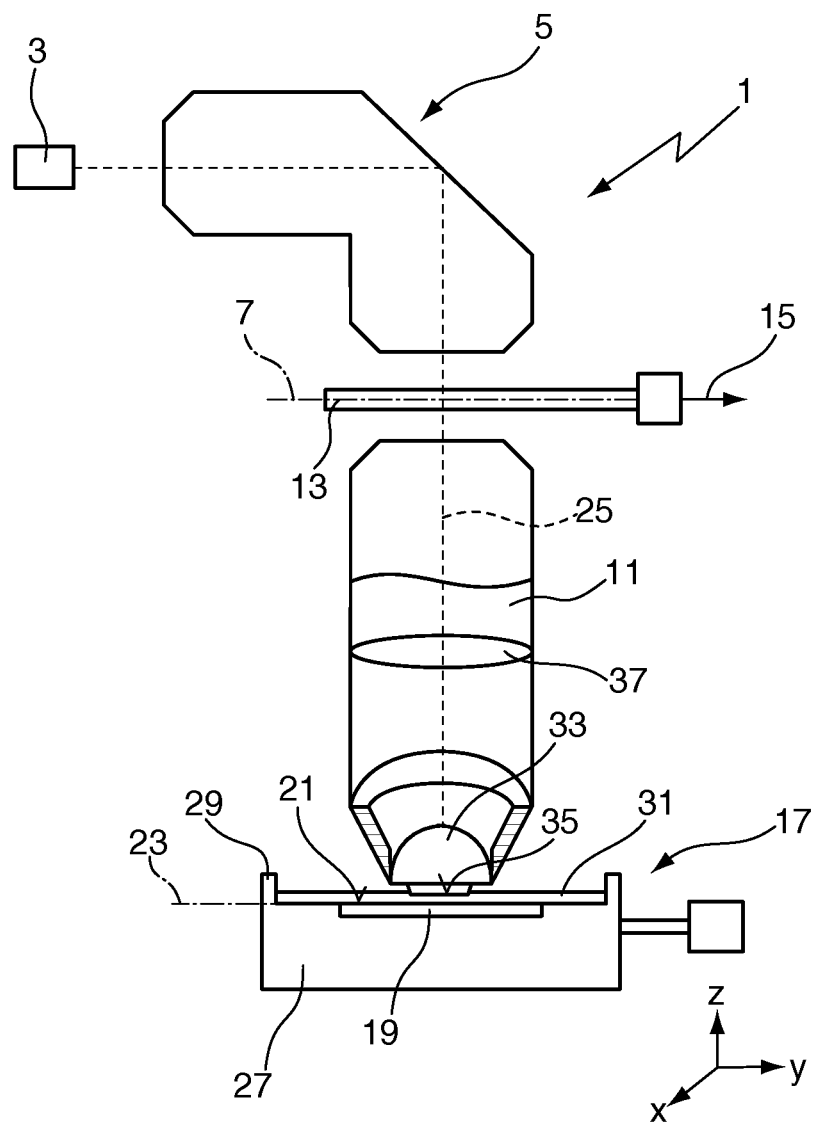
FIG. 1 shows a schematic illustration of a projection exposure apparatus for immersion lithography including an optical component which is in contact with an immersion liquid.

FIG. 1 schematically shows a microlithography projection exposure apparatus 1 provided for producing large-scale integrated semiconductor components via immersion lithography. The projection exposure apparatus 1 includes as light source an excimer laser 3 having an operating wavelength of 193 nm. Alternatively, light sources having other operating wavelengths, for example 248 nm or 157 nm could also be used. An illumination system 5 disposed downstream generates, in its exit plane or object plane 7, a large, sharply delimited, very homogeneously illuminated illumination field adapted to the desired telecentricity properties of a projection lens 11 disposed downstream. The illumination system 5 has devices for controlling the pupil illumination and for setting a predefined polarization state of the illumination light. In the beam path downstream of the illumination system 5, a device (reticle stage) for holding and moving a mask 13 is arranged such that the latter lies in the object plane 7 of the projection lens 11 and is movable in the plane for scanning operation in a driving direction 15.

The projection lens 11 follows downstream of the object plane 7, also designated as mask plane. The projection lens images an image of the mask with a reduced scale onto a substrate 19, for example a silicon wafer. The substrate is covered with a photoresist, also called resist 21. The substrate 19 is arranged such that the planar substrate surface with the resist 21 substantially coincides with the image plane 23 of the projection lens 11. The substrate is held by a device 17 including a drive for moving the substrate 19 synchronously with the mask 13. The device 17 also includes manipulators for moving the substrate 19 both in the z-direction parallel to the optical axis 25 of the projection lens 11 and in the x- and y-directions perpendicular to the axis.

The device 17 (wafer stage) provided for holding the substrate 19 is designed for use in immersion lithography. It includes a receptacle device 27, which is movable by a scanner drive and the base of which has a flat cutout for receiving the substrate 19. By virtue of a circumferential edge 29, a flat, upwardly open receptacle for an immersion liquid 31 is formed. The height of the edge is dimensioned such that the introduced immersion liquid 31 can completely cover the substrate surface with the resist 21 and the exit-side end region of the projection lens 11 can dip into the immersion liquid 31 with a correctly set working distance between lens exit and substrate surface 21.

The projection lens 11 has a virtually hemispherical planoconvex lens element 33 as the last optical element closest to the image plane 23, the exit surface 35 of the planoconvex lens element being the last optical surface of the projection lens 11. The exit surface 35 of the last optical element is completely immersed in the immersion liquid 31 during the operation of the projection exposure apparatus 1 and is wetted by the liquid. For the sake of completeness, FIG. 1 illustrates a further lens element 37 of the projection lens 11. The further lens element 37 is not in contact with the immersion liquid 31.

Optionally, the planoconvex element 33 (at its curved lens element surface facing away from the immersion liquid 31) is provided with an antireflection coating. The antireflection coating includes a sequence of alternately low refractive index and high refractive index materials. Appropriate low refractive index materials include, in particular at an operating wavelength of the projection exposure apparatus 1 of 193 nm, e.g., $MgF_2$, $AlF_3$, $Na_5Al_3F_{14}$, $Na_3AlF_6$, $SiO_2$, LiF and NaF. Suitable high refractive index materials include, for example, $LaF_3$, $GdF_3$, $NdF_3$, $Al_2O_3$ and $DyF_3$.

Figure 2:
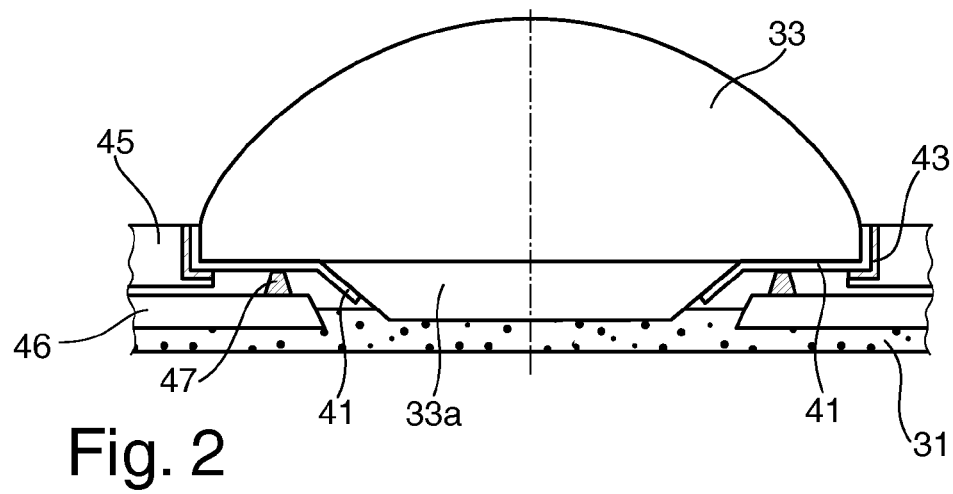
FIG. 2 shows a schematic illustration of a detail of the optical component from FIG. 1 including a radiation protective layer.

FIG. 2 shows a detail of the projection exposure apparatus 1 from FIG. 1 including the planoconvex lens element 33. The latter is inserted at its circumferential edge into a holder 45 (mount) and fixed there with the aid of an adhesive layer 43. A conically tapering partial region 33a of the planoconvex lens element 33 dips into the immersion liquid 31 with its end side. A circumferential seal 47 having a substantially triangular cross section is fitted between the planar partial region of the planoconvex lens element 33 and an end of a nozzle 46 serving for feeding and discharging the immersion liquid 31. The shaped seal 47 is produced from a hydrophobic material, to be precise from an (elastic) fluoropolymer. The seal 47 prevents water from being able to pass into the projection lens 11 and/or into that region of the side surface of the planoconvex lens element 33 to which the adhesive layer 43 is applied.

It goes without saying that the seal 47 can also have a different cross-sectional geometry and can be embodied e.g. as O-ring, i.e. having a circular cross section.

In the present example, the adhesive layer 43 is an epoxy resin, which is curable by UV radiation having a wavelength in the range of the mercury Mine, i.e. around approximately 365 nm, or via an LED lamp at a wavelength of approximately 365 nm-385 nm. However, neither the material of the adhesive layer 43 nor the material of the seal 47 is stable against long-term irradiation with UV light at the operating wavelength of the projection lens 11 (193 nm or 248 nm) under the intensities used in microlithography. This is because, as a result of intensive UV radiation acting on the (cured) adhesive, after some time a significant loss of adhesion occurs owing to damage to the interface of adhesive polymer—lens element. In order to protect the adhesive layer 43 and the seal 47 against stray radiation from within the planoconvex lens element 33, a radiation protective layer 41 is applied on the planoconvex lens element 33, the radiation protective layer extending from the circumferential edge region, to which the adhesive layer 43 is applied, over the planar side of the planoconvex lens element 33 and partly over the lateral surface of the conical partial region 33a of the planoconvex lens element 33.

In this case, the radiation protective layer 41 is opaque to radiation at the operating wavelength of the projection lens 11, that is to say that it has an absorption edge at approximately 260 nm (at an operating wavelength of 248 nm) or, if appropriate at approximately 220 nm (at an operating wavelength of 193 nm) and a sufficient thickness for effectively shielding radiation at the used wavelength.

For higher wavelengths in the range above approximately 360 nm however, the radiation protective layer 41 is substantially transparent in order to make it possible to cure the adhesive layer 43 e.g. via a mercury lamp (at 365 nm). If an LED lamp is used for curing the adhesive layer 43, e.g. at a wavelength of 385 nm, the radiation protective layer 41, can, if appropriate, also be designed such that it is transparent only at higher wavelengths or has a transmission of e.g. more than 40% there.

It goes without saying that, instead of a single radiation protective layer 41 extending over different partial regions of the planoconvex lens element 33, it is also possible, if appropriate, to use a radiation protective layer in which different materials are chosen for the different partial regions. Thus, by way of example, in that region of the lens element surface in which no adhesive layer 43 is applied to the radiation protective layer 41, it is not absolutely necessary for the radiation protective layer 41 to be transparent to wavelengths above approximately 360 nm.

Figure 3:
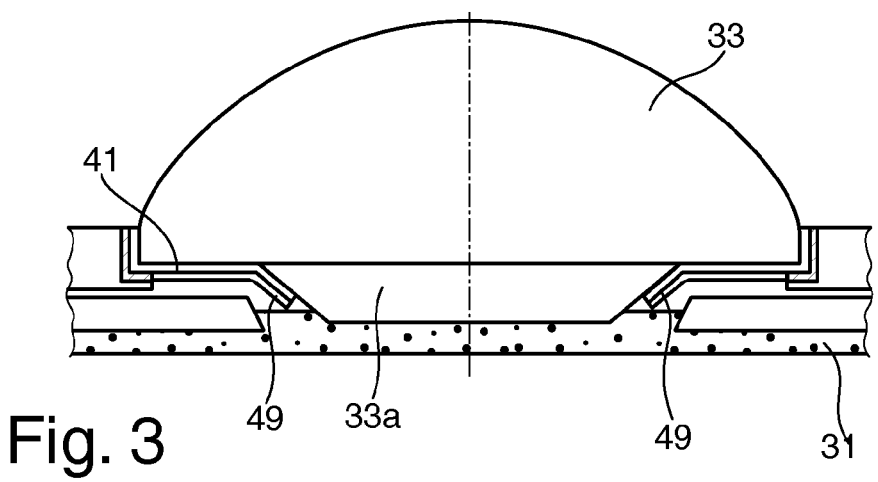
FIG. 3 shows a schematic illustration of a detail of the optical component from FIG. 1 including a radiation protective layer and a hydrophobic layer.

As is illustrated in FIG. 3, a water-repellant (hydrophobic) layer 49 can be applied to the radiation protective layer 41 in the region of the planar section of the lens element surface and also along the lateral surface of the conical lens element part 33a. Such a hydrophobic layer 49 generally likewise is a material which is not stable upon long-term irradiation with UV radiation, e.g. of a fluoropolymer. However, it is also possible to use chromium dioxide ($CrO_2$), silanes, siloxanes, DLC, fluorides, hydrophobic varnishes or other polymers as materials for the hydrophobic layer 49.

In the example shown in FIG. 3, owing to the hydrophobic layer 49, a seal between the planoconvex lens element 33 and the nozzle 46 has been dispensed with since the hydrophobic layer 49 is intended to prevent liquid from advancing into the region of the adhesive layer 43. It goes without saying, however, that even when such a hydrophobic layer 49 is present, if appropriate one or a plurality of sealing elements can additionally be provided in order to prevent the immersion liquid 31 from penetrating into the region of the mount 43 or into the interior of the projection lens 11.

Since the layer adhesion of the hydrophobic layer 49 and of the adhesive layer 43 is dependent on the material of the radiation protective layer 41, it can advantageous to use different materials for the radiation protective layer 41 in different sections. Thus, by way of example, in the partial region in which the hydrophobic layer 49 is applied, a layer material is used which is not necessarily transparent to radiation in the wavelength range around approximately 340 nm to 400 nm.

Both the radiation protective layer 41, the adhesive layer 43 and also the fluid-repellent layer 49 can be applied to the planoconvex lens element by a method such as e.g. sputtering, PVD, CVD, PECVD, cold gas spraying, spin coating, plasma spraying, dip coating and manual coating e.g. by brushing or application using a sponge, or by a sol-gel process. In particular manual application of varnish-like layers has proved to be particularly advantageous since complex mechanical coating methods can be dispensed with in this case.

The radiation protective layer 41 includes at least one oxide material which absorbs UV radiation at the operating wavelength and which is selected from germanium dioxide ($GeO_2$), antimony pentoxide ($Sb_2O_5$), aluminum oxide ($Al_2O_3$), niobium(V) oxide ($Nb_2O_5$), tin oxide ($SnO_2$), metal oxides of rare earths, in particular lanthanum oxide ($La_2O_3$) or cerium oxide ($CeO_2$), yttrium oxide ($Y_2O_3$), yttrium aluminum oxides, zinc oxide (ZnO), indium oxide ($In_2O_3$), bismuth trioxide ($Bi_2O_3$), barium titanate ($BaTiO_3$) and spinels, such as magnesium aluminate ($MgAl_2O_4$).

Germanium dioxide, in particular, has proven to be particularly suitable as material for the radiation protective layer 41 since it has a high absorption at the operating wavelength and a sufficient transmission at wavelengths for curing the adhesive layer 43. Thus, e.g. the transmission of germanium oxide is approximately 50% at a wavelength of approximately 354 nm, approximately 70% at a wavelength of approximately 363 nm, approximately 80% at a wavelength of 373 nm, and approximately 90% at a wavelength of 381 nm. Germanium oxide can also be added to the adhesive layer 43 itself as a filler in order to increase the resistance of the layer to the UV radiation at the operating wavelength. The properties of the adhesive layer 43 with regard to UV curing are influenced only insignificantly by such fillers provided that the fillers used are sufficiently transparent at the excitation wavelength of the UV adhesive.

All of the materials mentioned above can be applied to the planoconvex lens element 33 with a conventional mechanical process, e.g. by vapor deposition or by sputtering. However, a varnish-like radiation protective layer 41 has been found to be particularly favorable since it makes possible a good layer adhesion on the material of the planoconvex lens element 33 (quartz glass or calcium fluoride, if appropriate magnesium fluoride) and a good adhesion of the adhesive layer 43 applied to the radiation protective layer 41.

Such a varnish-like radiation protective layer 41 includes a binder, which can be embodied as inorganic, on the basis of alkyl silicates or potassium or sodium water glass, or organic, specifically in the form of epoxy resins free of aromatic compounds (cycloaliphatic or aliphatic epoxides). The oxide materials mentioned above can be introduced into the binder, to be precise advantageously in the form of nanoparticles that are added to the base resin in the form of a nanoscale dispersion. In this case, in particular antimony pentoxide ($Sb_2O_5$), zirconium dioxide ($ZrO_2$) and tin oxide ($Sn_2$) have proved to be particularly advantageous since they have an absorption edge that is typically at a longer wavelength than that of the base resin of the varnish binder used.

Figure 4:
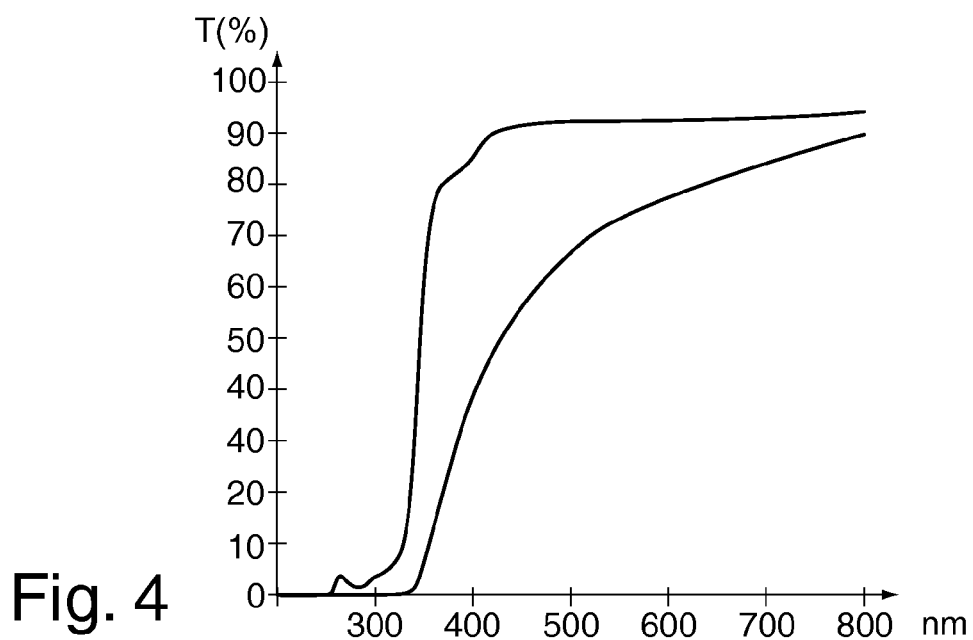
FIG. 4 shows an illustration of the transmission of a radiation protective layer as a function of wavelength.

One example of the shifting of the absorption edge toward longer wavelengths by using antimony pentoxide is shown in FIG. 4, which illustrates the transmission of a radiation protective layer 41 including a binder in the form of a cycloaliphatic epoxy resin, to be more precise of hydrogenated bisphenol A resin, which is offered under the trade name Epalloy 5000. An aliphatic amine, to be more precise isophorone diamine (H980), was used as a hardener, wherein methoxypropanol as solvent was additionally added to the binder. The upper transmission curve shown in FIG. 4 shows the transmission of such a (cured) radiation protective layer having a thickness of approximately 1 mm without the addition of nanoscale antimony pentoxide particles and the lower transmission curve with the admixture of the antimony pentoxide nanodispersion. The nanodispersion used can be, for example, a commercially available $Sb_2O_5$ sol-gel nanodispersion, e.g. AMT-130 (manufacturer: Nissan Chemical America Corp.).

As is clearly discernible in FIG. 4, the addition of the antimony pentoxide nanodispersion leads to a significant shift of the absorption edge of the radiation protective layer 41 to higher wavelengths. At the same time, an improvement in the varnish properties, in particular the varnish adhesion, was also observed.

In addition, pigment-grade carbon black and/or $Fe_3O_4$ as black pigment can also be admixed with the radiation protective layer 41. Black pigments have a high absorptivity even in the visible wavelength range and, as a result, are readily discernible on optical components. As a result, there is also the possibility of monitoring for possible damage to the radiation protective layer 41 after relatively long operation of the respective optical component. The addition of epoxy silanes as adhesion promoter for the radiation protective layer 41 on the glass substrate of the planoconvex lens element 33 has also proved to be of advantage.

Figure 5:
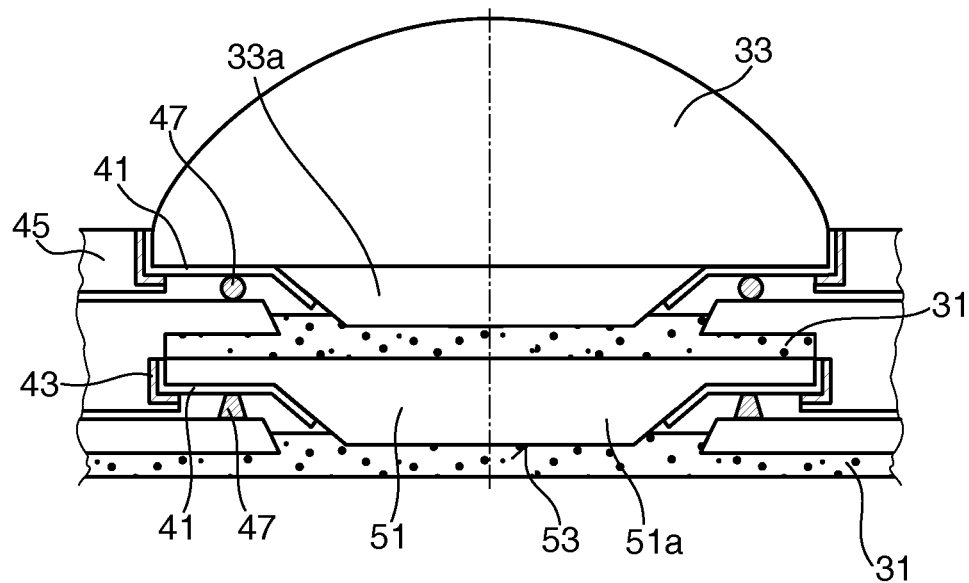
FIG. 5 shows an illustration analogous to FIG. 2 including a further optical component in the form of a plane plate.
Figure 6:
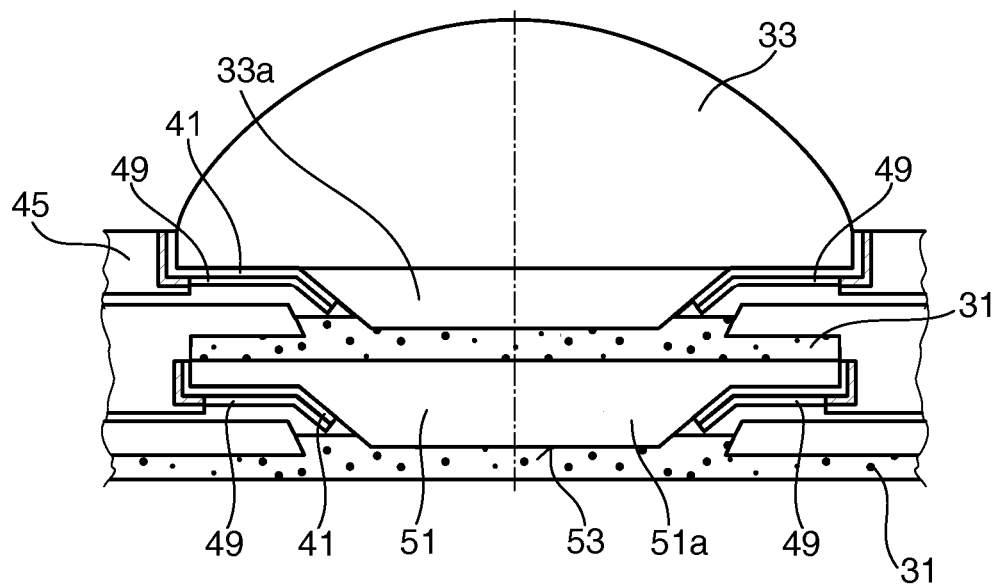
FIG. 6 shows an illustration analogous to FIG. 3 likewise including a further optical component in the form of a plane plate.

Finally FIG. 5 and FIG. 6 show the use of a radiation protective layer 41 in a projection exposure apparatus, in which, in addition to the planoconvex lens element 33 (cf. FIG. 3 or FIG. 4), a further terminating element 53 in the form of a plane-parallel plate 51 is also provided, the conical partial region 51a of which likewise dips into the immersion liquid 31, such that in particular, the planar end side 53 thereof is wetted by the immersion liquid 31. A radiation protective layer 41 is also applied to the plane plate 51, the radiation protective layer, analogously to FIG. 3, protecting the seal 47 and respectively the adhesive layer 43 against stray radiation and, analogously to FIG. 4, protecting the hydrophobic layer 49 against stray radiation.

In the present example, water was used as immersion liquid 31, but it goes without saying that other high refractive index liquids can also be used as immersion liquid, in particular nonpolar liquids. In this case, e.g. a hydrophilic layer can be used as fluid-repellent layer. It also goes without saying that, in contrast to what is shown in FIG. 5 and FIG. 6, different immersion liquids can also be used for wetting the planoconvex lens element 33 and the plane plate 51.

The above examples were described on the basis of the use of one radiation protective layer 41, one adhesive layer 43 and one hydrophobic layer 49. It goes without saying, however, that a coating i.e. a layer system including a plurality of layers one above another, can in each case be used instead of an individual layer. Moreover, the optical components 33, 51 can also be provided with further coatings or layers, e.g. with a reflection-reducing coating in the region of the end side 35, 53, i.e. in the region of the optically free diameter. Such an antireflection coating usually includes a plurality of layers in which high and low refractive index materials alternate and which can be provided with a topmost layer ("capping layer") composed, for example, of $SiO_2$ or Teflon for protection against degradation by water.

Moreover, the radiation protective layer 41 can be fitted not only in the region of the end side 35, 53 of the optical components 33, 51, but also on the opposite side, facing away from the immersion liquid 31, of the optical components 33, 53. By way of example, the radiation protective layer 41 can be provided on the spherically curved surface of the planoconvex lens element 33 and serve there as an aperture stop which delimits the optically free diameter of the planoconvex lens element 33. Alternatively or additionally, a radiation protective layer on the curved lens element surface of the planoconvex lens element can also serve for protecting further components against stray radiation and/or for applying an adhesive layer that makes it possible to connect the planoconvex lens element 33 at the top side thereof to a mount. It goes without saying that the radiation protective layer can correspondingly also be applied in a partial region of that end side of the plane-parallel plate 51 which faces away from the immersion liquid 51.

What is claimed is:

1. An article, comprising:
 an optical component; and
 a layer supported by the optical component, the layer comprising:
  an oxide material selected from the group consisting of germanium dioxide ($GeO_2$), antimony pentoxide ($Sb_2O_5$), aluminum oxide ($Al_2O_3$), niobium oxide ($Nb_2O_5$), tin oxide ($SnO_2$), metal oxides of rare earths, zinc oxide (ZnO), indium oxide ($In_2O_3$), bismuth trioxide ($Bi_2O_3$), barium titanate ($BaTiO_3$) and spinels; and
  a binder containing an aromatic compound-free epoxy resin,
 wherein:
  the aromatic compound-free epoxy resin contains the oxide material;
  the layer is opaque to radiation at a wavelength of less than 260 nm; and
  the layer has a transmission of more than 25% at a wavelength of 360 nm.

2. The article of claim 1, wherein the oxide material is in the form of a plurality of nanoparticles dispersed in the binder.

3. The article of claim 2, wherein the plurality of nanoparticles has a maximum size of 100 nm.

4. The article of claim 2, wherein the plurality of nanoparticles has a size distribution with a maximum between 3 nm and 30 nm.

5. The article of claim 2, wherein the plurality of nanoparticles has a size distribution with a maximum between 10 nm and 20 nm.

6. The article of claim 2, wherein the layer has a transmission of more than 40% for radiation at a wavelength of 360 nm.

7. The article of claim 1, further comprising an adhesive supported by the layer.

8. The article of claim 7, wherein the adhesive is radiation-curable.

9. The article of claim 1, further comprising a fluid-repellent material supported by the layer.

10. The article of claim 9, wherein the fluid-repellent material is selected from the group consisting of chromium dioxide ($CrO_2$), silanes, diamond like carbon, fluorides, hydrophobic varnishes and polymers.

11. The article of claim 1, wherein the layer is disposed outside an optically free diameter of the optical component.

12. The article of claim 1, wherein the optical component is transparent to radiation at wavelengths of less than 260 nm.

13. The article of claim 1, wherein the optical component has a conical partial region.

14. The article of claim 1, wherein the optical component is a lens.

15. The article of claim 1, wherein the oxide material is selected from the group consisting of lanthanum oxide ($La_2O_3$), cerium oxide ($CeO_2$), yttrium oxide ($Y_2O_3$) and yttrium aluminum oxides.

16. The article of claim 1, wherein the layer has a transmission of more than 40% for radiation at a wavelength of 360 nm.

17. An arrangement, comprising:
 an article, comprising:
  an optical component; and
  a layer supported by the optical component; and
 a holder to hold the optical component,
 wherein the layer comprises:
  an oxide material selected from the group consisting of germanium dioxide ($GeO_2$), antimony pentoxide ($Sb_2O_5$), aluminum oxide ($Al_2O_3$), niobium oxide ($Nb_2O_5$), tin oxide ($SnO_2$), metal oxides of rare earths, zinc oxide (ZnO), indium oxide ($In_2O_3$), bismuth trioxide ($Bi_2O_3$), barium titanate ($BaTiO_3$) and spinels; and
  a binder containing an aromatic compound-free epoxy resin; and
 wherein:
  the aromatic compound-free epoxy resin contains the oxide material;
  the layer is opaque to radiation at a wavelength of less than 260 nm; and
  the layer has a transmission of more than 25% at a wavelength of 360 nm.

18. The arrangement of claim 17, further comprising a seal configured so that, during use of the arrangement, the oxide material protects the seal from stray radiation.

19. The arrangement of claim 17, wherein the layer has a transmission of more than 40% for radiation at a wavelength of 360 nm.

20. A projection system, comprising:
 an article, comprising:
  an optical component; and
  a layer supported by the optical component,
 wherein the layer comprises:
  an oxide material selected from the group consisting of germanium dioxide ($GeO_2$), antimony pentoxide ($Sb_2O_5$), aluminum oxide ($Al_2O_3$), niobium oxide ($Nb_2O_5$), tin oxide ($SnO_2$), metal oxides of rare earths, zinc oxide (ZnO), indium oxide ($In_2O_3$), bismuth trioxide ($Bi_2O_3$), barium titanate ($BaTiO_3$) and spinels; and
  a binder containing an aromatic compound-free epoxy resin; and
 wherein:
  the aromatic compound-free epoxy resin contains the oxide material;
  the layer is opaque to radiation at a wavelength of less than 260 nm;
  the layer has a transmission of more than 25% at a wavelength of 360 nm; and
  the projection system is a microlithography projection system.

21. The projection system of claim 20, wherein the optical component is a lens which is closest to an image plane of the projection lens.

22. The projection system of claim 20, wherein the layer has a transmission of more than 40% for radiation at a wavelength of 360 nm.

23. An apparatus, comprising:
an illumination system; and
a projection lens comprising an article, the article comprising:
an optical component; and
a layer supported by the optical component,
wherein the layer comprises:
an oxide material selected from the group consisting of germanium dioxide ($GeO_2$), antimony pentoxide ($Sb_2O_5$), aluminum oxide ($Al_2O_3$), niobium oxide ($Nb_2O_5$), tin oxide ($SnO_2$), metal oxides of rare earths, zinc oxide (ZnO), indium oxide ($In_2O_3$), bismuth trioxide ($Bi_2O_3$), barium titanate ($BaTiO_3$) and spinels; and
a binder containing an aromatic compound-free epoxy resin; and
wherein:
the aromatic compound-free epoxy resin contains the oxide material;
the layer is opaque to radiation at a wavelength of less than 260 nm;
the layer has a transmission of more than 25% at a wavelength of 360 nm; and
the apparatus is a microlithography projection exposure apparatus.

24. The apparatus of claim 23, wherein the layer has a transmission of more than 40% for radiation at a wavelength of 360 nm.

* * * * *

UNITED STATES PATENT AND TRADEMARK OFFICE
CERTIFICATE OF CORRECTION

PATENT NO. : 9,158,207 B2  
APPLICATION NO. : 13/564983  
DATED : October 13, 2015  
INVENTOR(S) : Hans-Joachim Weippert Page 1 of 1

It is certified that error appears in the above-identified patent and that said Letters Patent is hereby corrected as shown below:

In the Specification

Col. 2, line 11, delete "($InO_2$)," and insert -- ($SnO_2$), --.

Col. 5, line 8, delete "(MgF2)." and insert -- ($MgF_2$). --.

Col. 9, line 66, delete "($Sn_2$)" and insert -- ($SnO_2$) --.

Signed and Sealed this  
Twenty-second Day of March, 2016

Michelle K. Lee  
*Director of the United States Patent and Trademark Office*